United States Patent [19]

McElroy

[11] Patent Number: 4,622,653
[45] Date of Patent: Nov. 11, 1986

[54] BLOCK ASSOCIATIVE MEMORY
[75] Inventor: David J. McElroy, Houston, Tex.
[73] Assignee: Texas Instruments Incorporated, Dallas, Tex.
[21] Appl. No.: 666,012
[22] Filed: Oct. 29, 1984
[51] Int. Cl.⁴ .................................... G11C 15/00
[52] U.S. Cl. ............................. 365/49; 365/230
[58] Field of Search ............................. 365/49, 230
[56] References Cited

U.S. PATENT DOCUMENTS 4,257,110  3/1981  Lamb et al. .......................... 365/49

Primary Examiner—Joseph A. Popek
Attorney, Agent, or Firm—Rodney M. Anderson; John G. Graham

[57] ABSTRACT

A block associative memory includes a plurality of memory cell arrays (70 and 72) arranged in rows and columns. Addressing of memory cells in the arrays (70 and 72) loads the data contained in one row thereof into a row of sense amplifiers (74). The selected row constitutes a block of memory. The data in the accessed block is compared with key data from a key data generator (20) in an equalizer circuit (90). The data in a given row or block is arranged in word groups. Each word group is compared with the key data and a match output generated for each data word group matching the key data word group. This match is decoded to output the column location of that word. The steps of retrieving the block from memory and associating the block with the key search data is performed in a single step and then additional blocks are selected for association with the key data word.

25 Claims, 7 Drawing Figures

BLOCK ASSOCIATIVE MEMORY

TECHNICAL FIELD OF THE INVENTION

The present invention pertains in general to semiconductor memories and, more particularly, to associative memories or content addressable memories.

BACKGROUND OF THE INVENTION

Data in an associative memory or content addressable memory is not accessed by address as in conventional memories. Rather than being identified by location, the data is identified from properties inherent in its own value. To retrieve a word from associative store, a search key (or descriptor) is generated which represents particular values of all or some of the bits of the word to be retrieved. This word is presented to the associative memory and compared in parallel with the corresponding lock or tag bits of all stored words, and all words matching this key are signaled to be available. If the key lacks specificity or it is "loose", a large number of words will be accessed relating to this key. The memory might indicate the number of such words and the address thereof and would allow for examination of each of these words. The order in which they are examined is usually related to their order in the physical storage and, therefore, tells nothing of their value. Once a match is made with the key word, each of these words can be utilized or, if not wanted, flagged such that succeeding words can be retrieved.

An associative search can be fairly complex if the search key has only a few elements and the association is loose wherein there is a high probability of obtaining a large number of words that match the key. A more specific associative search would be that in which only one occurrence of a search key match exists. An example of this type of association is in the use of associative stores between levels in a memory hierarchy where the associative store is a scratch pad denoting the existance of a copy of a record in the next higher-level store. This is also the case with the use of associative storage in cache memory management.

In the logical structure of a fully associative memory, each bit therein is accessible for comparison with a desired bit of the key word. Therefore, the bits in the associative memory must be arranged in groups and each of the bits in each of these groups compared in parallel with the bits of the key word. The amount of circuitry required for very large associative memories can become quite unwieldily and expensive. Architectures of this type would not lend themselves to conventional processes such as those involved in fabrication of Dynamic Random Access Memories (D-RAM's). Therefore, there exists a need for a memory architecture that provides a certain degree of associative search without requiring the complicated circuitry of a fully associative memory.

SUMMARY OF THE INVENTION

The present invention disclosed and claimed herein comprises a semi-associative memory which includes a memory array for storing a plurality of data bits at predetermined locations therein. These data bits are arranged in data words having a predetermined bit length. The memory array is sectioned into blocks which contain a predetermined number of data words. Each of the blocks in the memory array is separately accessed and the data words therein compared with a prestored key word. A "true" comparison between the key word and any of the data words in the accessed block results in the output of a "match" signal for each of the matching data words. This match signal is decoded to determine the location of each of the matching data words. The steps of accessing a block, comparing and decoding are performed simultaneously.

In another embodiment of the present invention, the blocks in the memory array are queued such that they can be sequentially processed for comparison with the key data word. The location of each of the blocks and each of the matching data words therein provides the location of the matching data words in the memory array.

In yet another embodiment of the present invention, a masking word having a bit length equal to the key word is prestored and operable in conjunction with the comparing operation to mask off a portion of key word. This masking operation allows comparison of only the unmasked portion of the key word with the corresponding portion of the data word such that a true comparison is independent of the comparison between the masked portion of the key word and the corresponding portion of the data word.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
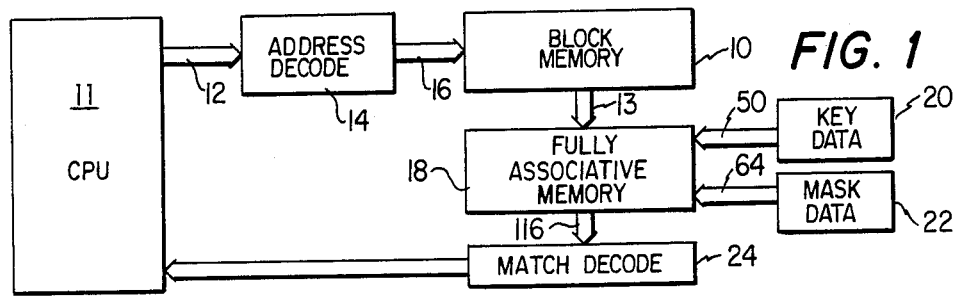
FIG. 1 illustrates a general block diagram of a block associative memory.

Referring now to FIG. 1, there is illustrated a schematic block diagram of a block associative memory in accordance with the present invention. A block memory 10 is provided which is comprised of a plurality of memory cells that provide main storage for data. The data therein is arranged in blocks in accordance with a predetermined pattern and this data is addressable by an address supplied by a central processing system 11. The address is input on an address bus 12 to an address decode circuit 14. The output of the decode circuit 14 is input to the block memory 10 on a control bus 16 to select one of the predetermined blocks of memory therein.

The block memory 10 has the output thereof connected to the input of a fully associative memory 18 through a connecting bus 13. The fully associative memory 18 contains either one block of the memory in the block memory 10 or portions of multiple blocks from the block memory 10. The memory 18 also receives an input from a key data generator 20 and an input from a mask data generator 22. The key data generated by the key data generator 20 is in the form of either a key search word, the preferred form, or a table of key data. The data generated by the mask data generator 22 is in the form of "masking bits" which mask off certain portions of the key data such that only a select portion of the key data is compared to the block of data retrieved and stored in the fully associative memory 18, as will be described hereinbelow.

The fully associative memory 18 is operable to receive key search data from the key data generator 20 and simultaneously compare this key data with all of the data stored therein. Therefore, within one clock cycle, the fully associative memory 18 makes a comparison and determines if any data therein matches the key data. For example, if the data stored within the fully associative memory 18 is comprised of sixteen sixteen-bit data words and the key data is comprised of a sixteen-bit key word, the fully associative memory 18 compares this key word with all sixteen sixteen-bit words within one cycle. If all of the bits in one of the stored words registers a comparison with the key word, this is determined to be a match or a "hit".

If all of the bits contained within the stored sixteen-bit words do not provide useful information, mask data is supplied to mask off the data bits that do not represent desired information, such that they are not compared with corresponding bits in the key word. For example, if each of the stored words is formatted with only the four most significant bits (MSB's) containing information regarding a parameter such as birthdates, then the twelve least significant bits (LSB's) are masked off and only the four MSB's of the stored data words and the four MSB's of the generated key word are compared. This is referred to as a "loose" comparison in which there is a high probability that a number of hits will be found.

After the generated key word is compared to the data stored in the fully associative memory 18, data is output to a match decode circuit 24 and decoded to output the address locations for the matched data. After an association has been made between the key data and the data contained within the associative memory 18, another block of memory is addressed in the block memory 10 and input to the fully associative memory 18. This next block of memory is then compared with the same key data, the match information stored, and the next successive block placed in the fully associative memory 18. This continues until all the blocks stored within the block memory 10 have been compared with the key data.

As will be described hereinbelow, the operation of addressing a particular block in the block memory 10, storing it in the fully associative memory 18 and comparing that data with the key data occurs simultaneously, such that only one clock cycle is required for this associative operation. By utilizing a separate fully associative memory and dividing the bulk memory into blocks, the amount of circuitry required to realize the fully associative memory 18 is significantly reduced. In addition, the simultaneous operation of addressing the block and comparing it with the key data significantly decreases processing time. Heretofore, a separate fully associative memory was interfaced with main memory in a processor with a requirement that the data be output onto a common bus and then stored in the fully associative memory. This operation of retrieving data from main memory and then storing it in a separate associative memory resulted in the use of costly processing time. This step of addressing and transferring data between two memories is deleted since this operation is simultaneous in the present invention.

Figure 2:
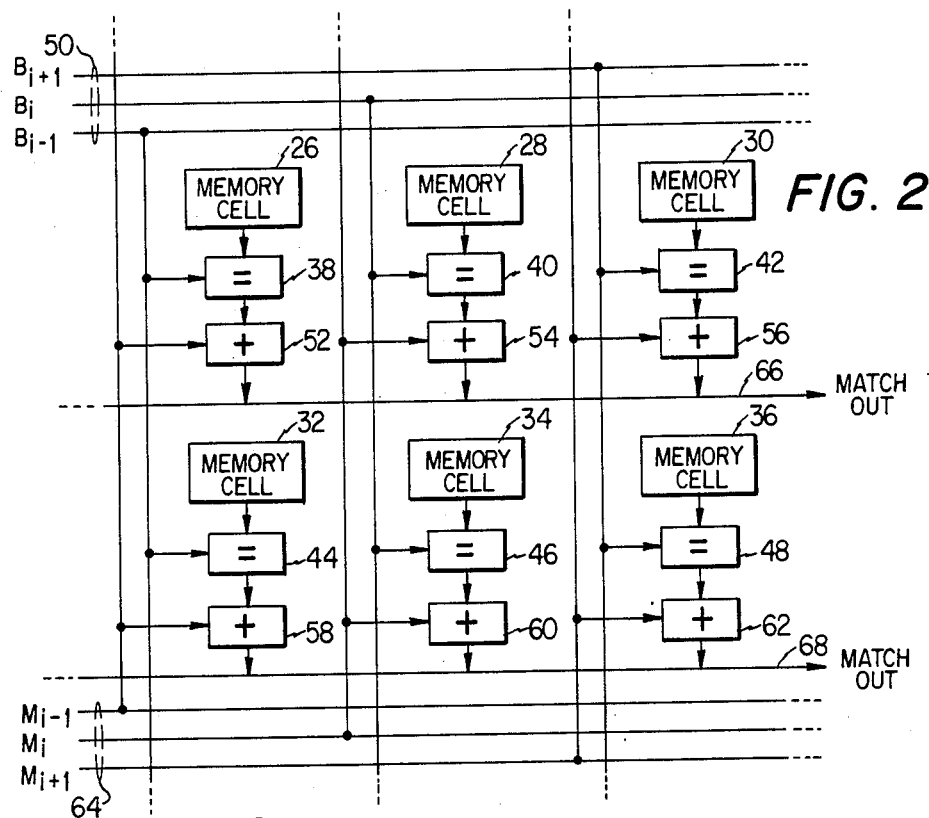
FIG. 2 illustrates a schematic block diagram of the fully associative portion of the memory.

Referring now to FIG. 2, there is illustrated a schematic block diagram of a portion of the fully associative memory 18 of FIG. 1. The memory is comprised of a plurality of memory cells of which six memory cells are illustrated. The memory cells contain data bits and are arranged in the form of words of which only three bits are illustrated. One of the words is comprised in part of memory cells 26, 28 and 30 and an adjacent word is comprised in part of memory cells 32, 34 and 36. The outputs of the memory cells 26-30 are input to equalizers 38, 40 and 42, respectively, and the outputs of the memory cells 32-36 are output to equalizers 44, 46 and 48, respectively. The equalizers 38-48 compare the contents of the respective memory cells with select bits of the key data.

The key data is comprised of a key word $B_n$ that is output by the key data generator 20 on data lines 50 labeled $B_{i-1}$, $B_i$ and $B_{i-1}$, representing three bits of the key word. The bit $B_{i-1}$ is input to the second input of both of the equalizers 38 and 44, the bit $B_i$ is input to the other input of both of the equalizers 40 and 46 and the bit $B_{i-1}$ is input to the other input of both of the equalizers 42 and 48. Therefore, the data bit stored in the memory cell 28 in the first data word and the data bit stored in the memory cell 34 in the second data word are simultaneously compared with the key bit $B_i$ to output a match therefrom. The data in the memory cell pair 26 and 44 and the memory cell pair 30 and 36 are compared in a similar manner to the key bits $B_{i-1}$ and $B_{i-1}$, respectively. The equalizers 38-48 perform an exclusive NOR function wherein both inputs have to be either a logic "1" or a logic "0" to provide an output therefrom.

The output of the equalizers 38-42 are input to OR circuits 52, 54 and 56, respectively, and the outputs of the equalizers 44-48 are input to OR circuits 58, 60 and 62, respectively. The other inputs of the OR circuits 52-62 receive mask data from the mask data generator 22. The mask data is input on data lines 64, of which three bits are illustrated labeled $M_{i-1}$, $M_i$ and $M_{i-1}$. The mask bit $M_{i-1}$ is input to both of the OR circuits 52 and 58, the mask bit $M_i$ is input to both of the OR circuits 54 and 60 and the mask bit $M_{i-1}$ is input to both of the OR circuits 56 and 62.

The output of the OR circuits 52-56 are connected to a common line 66 which represents a distributed AND circuit wherein all of the outputs of the OR gates 52-56 must be a logic "high" to provide a signal output from the distributed AND line 66. The OR circuits 58-62 have the outputs thereof connected to a distributed AND line 68 which is similar to the distributed AND line 66. In operation, the data in memory cells 26 and 32 is compared with the data bit $B_{i-1}$, data bit $B_i$ is compared with the data in memory cells 28 and 34 and the data bit $B_{i-1}$ is compared with the data in memory cells 30 and 36. In addition, data is input on the line 64 to determine whether the logic state on the output of the respective OR gates is dependent on the output from the respective equalizers. If a logic "1" is input to any of the OR circuits 52-62, the output will always be a logic "1". However, if a logic "0" is input thereto, the output is a function of the equalizer output. For example, if the logic state of the mask bit $M_{i-1}$ is a logic "1", then comparison between the contents of the memory cells 30 and 36 with the key bit $B_{i+1}$ is not a factor in determining whether there is a match output from the distributed AND lines 66 or 68. This is a "don't care" situation for the $B_{i+1}$ key bit.

Figure 3:
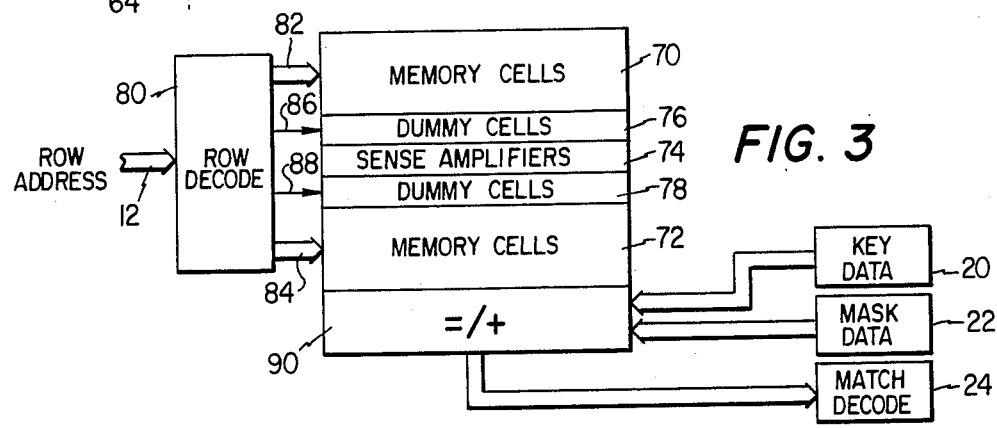
FIG. 3 illustrates a schematic block diagram of a D-RAM utilizing block association in accordance with the present invention.

Referring now to FIG. 3, there is illustrated a schematic block diagram of a conventional Dynamic Random Access Memory (D-RAM) MOS memory device which is described in U.S. Pat. No. 4,081,701, issued to L. S. White, Jr., et al, on March 28, 1978 and assigned to Texas Instruments Inc. The memory is comprised of an array of memory cells 70 and an array of memory cells 72 connected on opposite sides of a row of sense amplifiers 74. In addition, a row 76 of dummy cells and a row 78 of dummy cells are provided in accordance with conventional D-RAM technology. The memory cell arrays 70 and 72 are arranged in rows and columns with one sense amplifier associated with each column of memory cells such that activation of one row of memory cells couples an individual memory cell with each sense amplifier. Simultaneous with connection of a memory cell to one side of a sense amplifier in the sense amplifier row 74, a dummy cell in either of the rows 76 or 78 is also connected to the sense amplifier. For example, if one row is activated in the memory cell array 70, the dummy cells in the row 78 are connected to the other side of the sense amplifiers in the sense amplifier row 74. The selection of the particular row of memory cells and the particular row of dummy cells is determined by a row decode circuit 80 which is interfaced through a control bus 82 to the memory cell array 70 and through a control bus 84 to the memory cell array 72. Control lines 86 and 88 are connected to the dummy cell rows 76 and 78, respectively. The row decode circuit 80 is operable to receive a row address on the address bus 12 and activate the appropriate row of memory cells in the corresponding row of dummy cells. The operation of the sense amplifiers, dummy cells and memory cells is described in more detail in U.S. Pat. No. 3,909,631, issued to Kitagawa on Aug. 2, 1973, and assigned to Texas Instruments Inc.

Once a row of memory cells has been selected, the output of the sense amplifiers is input to an equivalence circuit 90 which receives the outputs from all of the sense amplifiers 74 and also the key mask words from the key data generator 20 and the mask data generator 22, respectively. The output of the equivalence circuit 90 is input to the match decode circuit 24 to determine the address of the matched data.

In operation, the memory of FIG. 3 would have a defined number of columns and rows. Each row can be individually addressed with each element in the addressed row connected to one of the sense amps. The data that is addressed in a given row and sensed by the individual sense amp constitutes a "block" of memory, and the individual rows of memory cells constitute the remaining blocks of memory. The sense amplifiers in the sense amplifier row 78 and the equivalence circuit 90 are equivalent to the fully associative memory 18 in FIG. 2 in that a single block of data is loaded therein and compared to the key word. After each block is compared to the key word, the row decoder 80 then steps through the remaining rows and compares the bits therein with the respective bit of the key search word.

Figure 4:
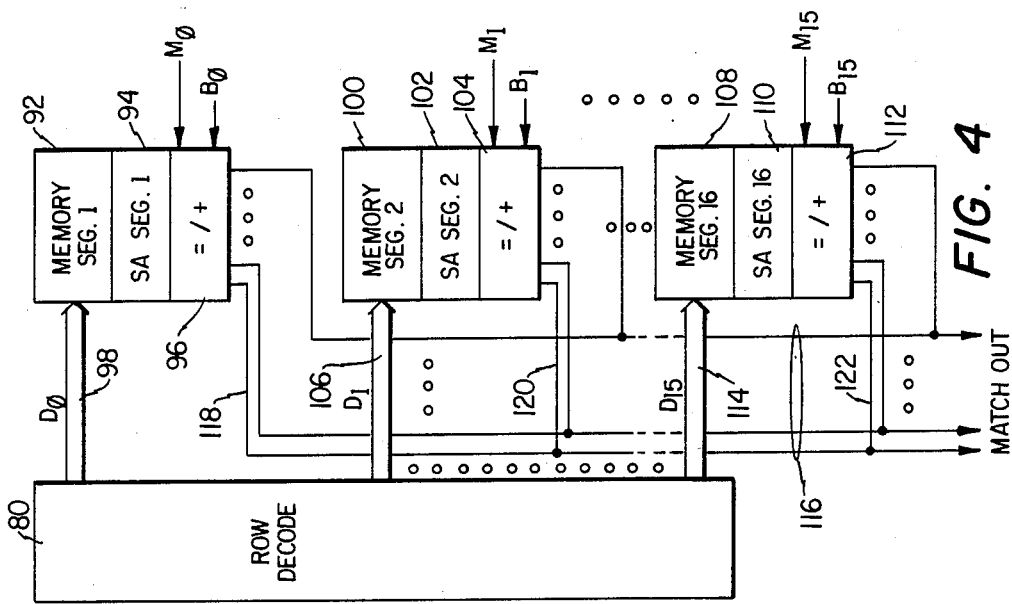
FIG. 4 illustrates a schematic block diagram of the various segments in the block associative memory of FIG. 3.

Referring now to FIG. 4, there is illustrated a schematic block diagram of the memory of FIG. 3 divided into sixteen individual segments for comparing a sixteen-bit key search word and a sixteen-bit mask word with sixteen-bit data words. The individual segments each represent the memory space in which one bit of a data word Dn is stored. One method for implementing this segmentation in a memory having 256 memory elements in each row is to place the first bit $D_o$ of each of sixteen data words in the first sixteen memory elements, the second bit $D_1$ in the next sixteen memory elements, etc.

The first segment is comprised of a memory segment 92 labeled "MEM SEG #1", a sense amp segment 94 labeled "SA SEG #1", and an equalizer 96. The memory segment 92 receives its address from the row decoder 80 through a bus 98. The bus 98 is labeled "$D_o$" to represent the first bit in the data word. The equalizer 96 has input thereto the first bit of mask word $M_o$ and the first bit of the key search word $B_o$. A second memory signal is comprised of a memory segment 100 labeled "MEM SEG #2", a sense amp segment 102 labeled "SA SEG #2" and an equalizer 104. The memory segment 100 is addressed from the row decoder 80 through a bus 106 labeled "$D_1$," and an equalizer 104 receives the second bit of the masked word $M_1$ and the second bit of the key search $B_1$. There are thirteen more segments not illustrated with the sixteenth segment illustrated as comprised of a memory segment 108, a sense amp segment 110 and an equalizer 112. The sixteenth segment has the memory segment 108 addressed by the row decoder through a bus 114 and labeled "$D_{15}$" and the equalizer 112 has input thereto the most significant bit $M_{15}$ of the mask word and the most significant bit $B_{15}$ of the key search word. Although the row decoder 80 is illustrated as having sixteen address lines output therefrom, it should be understood that all of the data is contained in a single row and requires only one address line.

The equalizers 96, 104 and 112 have one output for each sense amp in the segments 94, 102 and 110, respectively. As described above, each of the segments represents a particular bit in all of the data words stored in the memories. Upon addressing each of the memory segments, the various bits in the selected row will be connected to the respective one of the sense amps. The equalizers 96, 104 and 112 then compare the selected bit with the respective key search bit to determine if there is a match. The match output is then output to a set of data lines 116 which has a first logic state representative of a match condition and a second logic state representative of a mismatched condition. However, the respective masking bit input to the equalizer will maintain the output in the matched condition if a masking function for that bit is selected.

The matched outputs from the equalizers 96, 104 and 112 are connected in parallel such that all of the bits corresponding to one data word are connected to a common line. For example, one data word contained within the memory and selected by the row decoder 80 has the first bit thereof compared with the key bit $B_0$ in the equalizer 96 and the corresponding match output connected to a data line 118. In a similar matter, the second bit of the same data word would be compared with the key bit $B_1$ in the equalizer 104 and the match output connected to a corresponding data line 120. This continues for the remainder of the bits in the same data word with the sixteenth data bit compared to the key bit $B_{15}$ and the match output from the equalizer 112 connected to a data line 122. The data lines 118, 120 and 122 are all commonly connected to one line in the group of data lines with the lines 118, 120 and 122 functioning as a distributed AND function wherein all of the match outputs connected to those data lines must each provide a match output in order to provide an overall match output. This would represent the situation where all bits in a stored data word directly correspond to the bits in the key search word, thus resulting in a matched condition or a "hit".

In the above example, there are 256 elements per row corresponding to sixteen sixteen-bit data words selectable by row decoder 80. Therefore, when the sense amps are segmented, as illustrated in FIG. 4, the sixteen data words in the selected row are simultaneously compared with the key search word and the match condition for each data word output to the match decoder 24. This occurs in one clock cycle and does not require transfer of data between two memories since the sense amps are common to all of the memory elements within the memory cell arrays 70 and 72 of FIG. 3. Only one address signal is required for transfer of a block of data to the sense amps and associated equalizer circuits for association with the key data.

Figure 5:
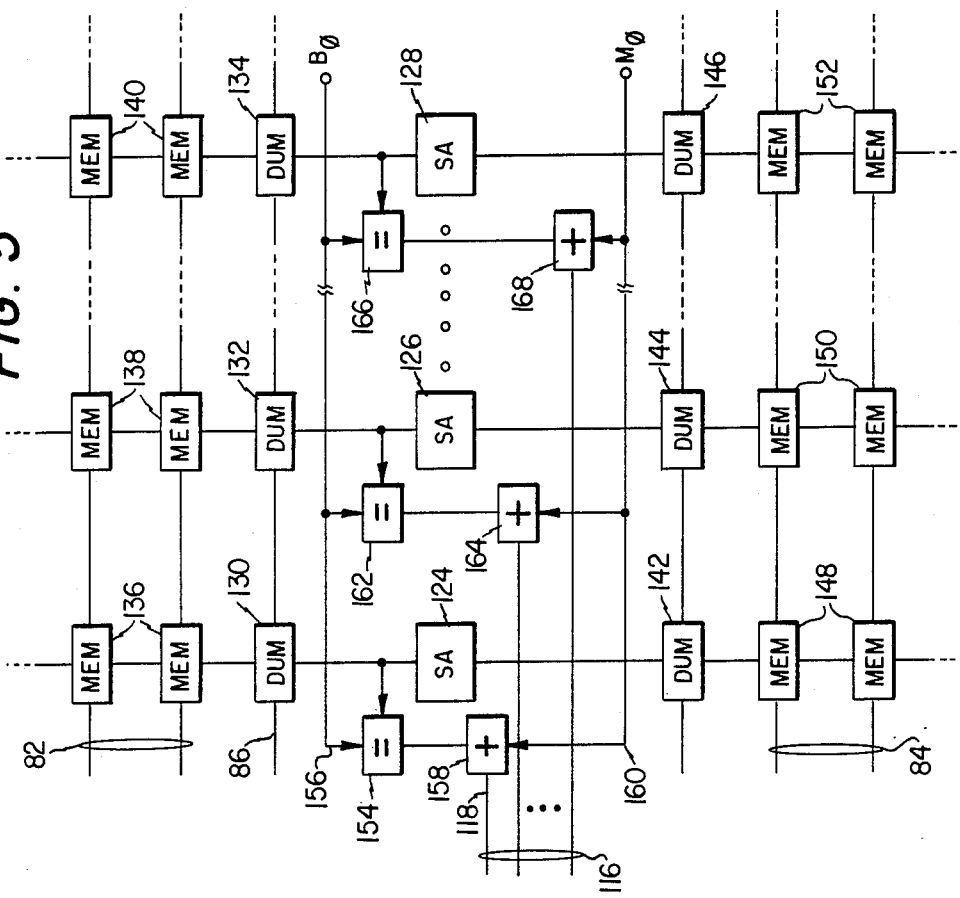
FIG. 5 illustrates a schematic block diagram of one of the segments in FIG. 4.

Referring now to FIG. 5, there is illustrated a schematic block diagram of the equalizer 96, the sense amplifier segment 94 and the memory cells in the memory segment 92 of FIG. 4. The sense amplifier segment 94 is comprised of sixteen sense amplifiers of which the first two are represented by a sense amplifier 124 and a sense amplifier 126 with the sixteenth sense amplifier represented by a sense amplifier 128. One side of each of the sense amplifiers 124–128 is connected to dummy cells in the row 76 which are represented by blocks 130, 132 and 134 for the respective columns. On the same side of the sense amplifiers 124–128, individual memory cells from the memory cell array 70 are indicated by blocks labeled "MEM". In the illustrated example, two memory cells 136 of the memory cell array 70 are connected to the sense amplifier 124, two memory cells 138 of the memory cell array 70 are connected to the sense amplifier 126 and two memory cells 140 of the memory cell array 70 are connected to the sense amplifier 128.

The opposite side of the sense amplifiers 124–128 are connected to corresponding dummy cells from the row 78 and also to individual memory cells of the memory cell array 72. The dummy cells connected to the sense amplifiers 124–128 are represented by blocks 142, 144 and 146, respectively. The memory cells associated with the memory cell array 72 are represented by memory cells 148 connected to sense amplifier 124, memory cells 150 connected to sense amplifier 126 and memory cells 152 connected to sense amplifier 128. By activation of the appropriate row lines 82 or 84 and the corresponding one of the dummy cell control lines 86 or 88, the contents of a desired memory cell can be read.

The sense amplifier 124 provides two outputs. One output is labeled D for the data output and the other output is labeled $\overline{D}$ for the inverted data output. Both of these outputs are input to an equalizer circuit 154. The other input of the equalizer 154 is connected to a control line 156 for receiving the first key bit $B_0$ to be compared to the first data bit $D_0$ stored in the memory segment 92. The output of the equalizer 154 is input to the OR circuit 158, the other input of which is connected to a line 160 for receiving the first mask bit $M_0$. The output of the OR circuit 158 is connected to the data line 118 which is a part of the group of data lines 116 representing the distributed AND circuit function. The sense amplifier 126 has the two data outputs connected to an equalizer circuit 162, the other input of which is connected to control line 156 for receiving $B_0$. The output of the equalizer 162 is connected to one input of an OR circuit 164, the other input of which is connected to the mask bit $M_0$. The output of the OR circuit 164 is connected to one line in the group of data lines 116. The sense amplifier 128 has the data outputs thereof connected to the input of an equalizer 166, the other input of which is connected to the key bit $B_0$ and the output of which is connected to one input of an OR circuit 168. The other input of the OR circuit 168 is connected to the masked bit $M_0$ and the output thereof is connected to one line in the group of data lines 116.

In operation, one of the rows of memory cells in the memory segment 92 is selected and connected to one side of the sense amplifier segment 94. As described above, the data contained in each memory cell in a given row of the memory segment 92 represents the first bit $D_0$ of all data words corresponding to a given block of memory. For a given row, the data bits $D_0$ are loaded into each sense amplifier in this segment 94 and stored on the output thereof for processing through the respective equalizers and OR circuits. In this manner, the outputs can be compared with the key bit $B_0$ to determine if a match exists. If any of the sense amplifiers in this segment contain a bit corresponding to the key bit $B_0$, the respective one of the data lines 116 will indicate a match. In addition, the OR circuits allow masking off of all of the bits contained in a given segment.

Figure 6:
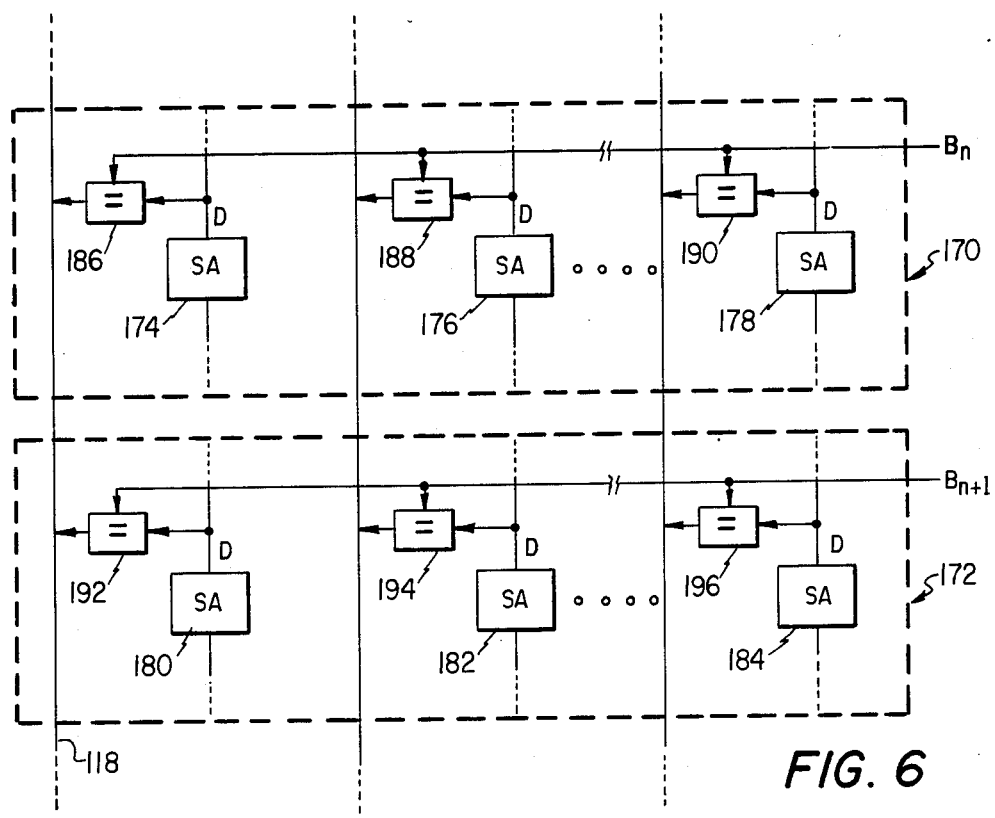
FIG. 6 illustrates two adjacent segments and the logic for determining the presence of a match.

Referring now to FIG. 6, there is illustrated two adjacent segments 170 and 172 of the sixteen segments illustrated in FIG. 4 with the segment 170 corresponding to stored data for the data bit $D_n$ and the segment 172 corresponding to the stored data bits for $D_{n-1}$. Three sense amplifiers 174, 176 and 178 represent the first, second and sixteenth sense amplifiers in the segment 170 and three sense amplifiers 180, 182 and 184 represent the first, second and sixteenth sense amplifiers in the segment 172. The sense amplifiers 174–178 have the data outputs thereof connected to the inputs of equalizers 186, 188 and 190, respectively. The sense amplifiers 180–184 have the data outputs thereof connected to one input of equalizers 192, 194 and 196, respectively. The inputs of the equalizers 186–190 in the segment 170 have the other inputs thereof connected to the key bit $B_n$ and the equalizers 192–196 in the segment 172 have the other inputs thereof connected to the key bit $B_{n-1}$. Therefore, the data bits connected to the sense amplifiers in the segment 170 are compared to $B_n$ and the data bits connected to the sense amplifiers 180–184 in the segment 172 are compared with the key bit $B_{n-1}$. The OR circuits illustrated in FIG. 5 have been omitted in FIG. 6 for illustrative purposes only.

The sense amplifier 174 in the segment 170 and the sense amplifier 180 in the segment 172 correspond to two adjacent bits in a given data word. The outputs of these equalizers 186 and 192 associated with the respective sense amplifiers 174 and 180 are connected to the output line 118 which, as described above, is one of the group of lines 116 that each provide a distributed AND function. The line 118 is common to all of the remaining equalizers associated with sense amplifiers containing data bits of the same data word. In a similar manner, the sense amplifiers 176 and 182 represent adjacent bits in a given data word and the sense amplifiers 178 and 184 also represent adjacent bits in a separate data word. The outputs of the associated equalizers are input to a separate line in a group of lines 116 such that all of the bits in a given data word are compared with the key search word and all of the data words corresponding to a given block or selected row are simultaneously compared with the key search word.

After a given row has been compared to the key search word, the next sequential row is selected and a comparison of the data in that row made with the key search word. If, for example, there are 256 rows, with each row having sixteen sixteen-bit words contained therein, 256 comparisons are required to search the entire memory space. The total time required for each sample is equal to the amount of time required to generate the next sequential address and apply it to the memory cells 70 and 72.

Figure 7:
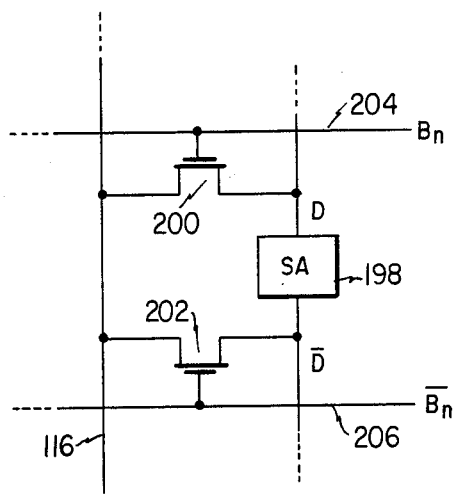
FIG. 7 illustrates a schematic block diagram of one sense amplifier with the associated logic circuitry for comparing the data output thereby with one bit of the key word.

Referring now to FIG. 7, there is illustrated a schematic block diagram of one sense amplifier 198 representative of one of the sense amplifiers in the sense amplifier row 74 of FIG. 3. The sense amplifier 198 is of the type described in U.S. Pat. No. 3,909,631 and provides two outputs. One output is labeled D and is comprised of the true data and the other output is labeled $\overline{D}$ and comprises the inverted data. The D output is connected to one terminal of an FET gate 200 and the $\overline{D}$ output is connected to one terminal of an FET gate 202. The gate of the FET 200 is connected to a data line 204 having the key bit $B_n$ connected thereto. The gate of the FET 202 is connected to a data line 206 having the inverse of the key bit $B_n$ apply thereto. The other terminal of the FET's 200 and 202 is connected to one of the data lines 116. The sense amp 198 presents a high impedance to either of the data outputs D and $\overline{D}$ when in a logic "1" state and a low impedance when in a logic "0" state. Therefore, current is "sinked" by the sense amp through either of the transistors 200 or 202 in the mismatch condition where D or $\overline{D}$ is a logic "0" and B or $\overline{B}$ is a logic "1".

In operation, the FET's 200 and 202 provide an exclusive NOR function. When $B_n$ is a logic "1" and the data output by the sense amplifier 198 is a logic "1", the FET 200 is turned on but no current is sinked, indicating a match. In this case, the inverse of $B_n$ will be a logic "0", thus turning off the FET 202. If the data output by the sense amplifier 198 were a logic "0", no match would exist and the FET 200 would allow the sense amplifier 198 to sink current from the line 116. In the opposite condition, the key bit $B_n$ would be a logic "0" which would not turn on the FET 200. However, the inverse of $B_n$ on line 206 would turn on FET 202 to connect the output of the sense amplifier 198 to line 116. A match condition wherein a logic "0" is stored in the memory cell would result in a logic "1" output on the $\overline{D}$ output. This will also result in a logic "1" or high impedance being output by the FET 202 to the line 116.

As described above, the line 116 represents a group of lines with each line providing a distributed AND function which requires a match indication from every sense amplifier interfaced therewith. This would be implemented by sourcing current to each of the lines in the group of lines 116 with a current source (not shown) and detecting the current supplied thereto. A matched condition requires that a high impedance be presented to each of the lines 116 by every sense amplifier interfaced therewith, whereas a mismatch condition would result in current being drawn from the source through one of the lines 116. Although not shown, the masking function can utilize gates placed in series with $B_n$ and its complement to maintain the logic states thereof at a logic "0" for the masked condition.

In summary, there has been disclosed a semi-associative memory which includes a plurality of memory cells that are accessible in blocks, each block having the memory cells arranged in a predetermined order. Circuitry is provided for selecting one of these blocks and comparing it with a key search word. Each of the blocks is sequentially selected and compared with the key search word such that the comparison step is simultaneous for each block and the time to step from one block to the other is merely the address time of a standard D-RAM.

Although the preferred embodiment has been described in detail, it should be understood that various changes, substitutions and alterations can be made therein without departing from the spirit and scope of the invention as defined by the appended claims.

What is claimed is:

1. A semi-associative memory, comprising:

memory means for storing a plurality of data bits at predetermined memory locations and arranged in word groups, said memory means sectioned into blocks, each of said blocks containing a predetermined number of said word groups;

block access means for accessing each of said blocks in said memory means;

key data means for storing key bits arranged in a key data word group representative of desired search parameters each of the key bits corresponding to one of the data bits in each of said data word groups;

comparison means for simultaneously comparing the key bits of said key data word group with the corresponding data bits in each of said data word groups in the accessed one of said blocks and outputting a match signal for each match between all of the key bits in said key word group and all of the data bits in each of said accessed data word groups; and matched decode means for determining the location of each of said data word groups associated with one of said matched signals;

said block access means, said comparison means and said decode means operating simultaneously to determine the memory locations of the matching ones of said data word groups.

2. The semi-associative memory of claim 1 and further comprising queuing means for controlling said block access means to sequentially select said blocks in a predetermined order such that all of said blocks have the contents thereof compared with said comparison means.

3. The semi-associative memory of claim 1 and further comprising masking means for masking of selected ones of the key bits in said key data word group, the data bits in the compared one of said data word groups corresponding to said masked key bits indicating a match regardless of the information contained therein such that only portions of said key data word group are compared to corresponding portions of said accessed key data word groups to determine the match condition.

4. The semi-associative memory of claim 1 wherein said data word groups comprise digital data words having a predetermined number of bits and said key word group comprises a single data word having a correspondingly equal number of key bits.

5. The semi-associative memory of claim 1 wherein said memory means comprises a plurality of memory cells arranged in rows and columns with each of said blocks consisting of one row.

6. The semi-associative memory of claim 1 wherein said predetermined memory locatations are dynamic random access memory cells and said block access means comprises:
    row address means for addressing a single row of said memory cells: and
    a plurality of sense amps, each of said sense amps associated with one of said columns for determining the logic state in each of said dynamic random access cells in the accessed one of said rows.

7. The semi-associative memory of claim 1 wherein each of said data bits has first and second binary logic states and said comparison means comprises exclusive NOR means for outputting a match signal only when the compared data and key bits are in the same state.

8. A semi-associative memory, comprising:
    a plurality of memory cells for storing binary data bits, said memory cells arranged in rows and columns, said data bits in each of said rows arranged in data words having a predetermined bit length;
    row address means for addressing a select one of said rows of memory cells as a block of data;
    key data storage means for storing a plurality of key bits arranged in a key data word group, the number of said key bits equal to the number of said data bits in each of said data words;
    comparison means for simultaneously comparing the data bits in each of said data words in said addressed block with corresponding ones of the key bits in said key word and outputting a match signal for each true comparison, said match signals indicative of the memory locations of the matching data words in said addressed block;
    decode means for receiving said match signals and determining the memory location thereof in the addressed one of said blocks; and
    said row address means, comparison means and decode means operating simultaneously.

9. The semi-associative memory of claim 8 and further comprising queuing means for controlling said row address means to sequentially step through all of said rows such that all of said data words stored in said memory cells are compared with said key data word.

10. The semi-associative memory of claim 8 and further comprising masking means for masking off a portion of said key data words such that only the unmasked portion of said key word is compared with said data words in said addressed block by said comparison means.

11. The semi-associative memory of claim 10 wherein said masking means comprises:
    storage means for storing a masking word having a bit length equal to said key data word, the bits in said masking word being at a first logic state to indicate a masking function and a second logic state to indicate a nonmasking function; and
    means for controlling said comparison means to indicate a true comparison for each bit of said data word corresponding to the bits of said masked word in the first logic state such that generation of said matched signals is not dependent on the comparison between the bits of said data word and said key word corresponding to the bits of said masked word in the first logic state.

12. The semi-associative memory of claim 8 wherein said memory sells are dynamic random access memory cells and said row address means comprises a row decoder and a sense amp connected to each of said columns for determining the logic state of each of said memory cells in the addressed one of said rows.

13. The semi-associative memory of claim 8 wherein said comparison means comprises:
    exclusive NOR means connected between each bit of said key word and the corresponding bit of each of said data words to generate an output signal only when the compared bits are in the same logic state; and
    distributive AND means for receiving the output from said exclusive NOR means corresponding to all of the bits in each of said data words and generating said match signal when an output is provided from said exclusive NOR means for each of the data bits in each of said data words, one of said match signals corresponding to each of said data words in said addressed block.

14. A method for associating stored data with a predetermined set of parameters, comprising:
    storing a plurality of data bits at predetermined memory locations and arranged in word groups, the word groups sectioned into blocks of word groups which each contain a predetermined number of word groups;
    accessing a select one of the blocks of word groups;
    storing the predetermined association parameters as key bits arranged in a key word group;
    simultaneously comparing the key bits of the key word group with each of the data word groups in the accessed one of the blocks and outputting a match signal for each of the data word groups in the access block when all of the bits therein compare with all of the bits in the key word group; and
    determining the location of each of the data word groups associated with a match signal;
    accessing of the blocks, comparison thereof and decoding thereof in a simultaneous operation.

15. The method of claim 14 and further comprising queuing the blocks and sequentially accessing each of the blocks in the queue for comparison of the data word groups therein with the key data word group.

16. The method of claim 14. and further comprising masking off portions of the key bits in the key word groups such that only the remaining portion thereof is compared with the corresponding portion in the data word groups.

17. A semi-associative memory, comprising:
    memory means for storing a plurality of data bits at predetermined memory locations and arranged in word groups, said memory means sectioned into blocks, each of said blocks containing a predetermined number of said word groups:
    block access means for selectively accessing one of said blocks in said memory means;
    key data means for storing key bits arranged in a key data word group representative of desired search parameters, each of the key bits corresponding to one of the data bits in each of said data word groups;
    comparison means for, upon the access of one of said blocks, comparing in parallel the key bits of said key data word group with the corresponding data bits in each of said data word groups in said accessed block;
    output means, responsive to said comparison means, for outputting a signal representative of the locations of those data word groups in said accessed block having their corresponding data bits matching all of said key bits of said key data word.

18. The semi-associative memory of claim 17 further comprising queuing means for controlling said block access means to sequentially select said blocks in a predetermined order such that a pluraltiy of said blocks have their contents thereof compared with said comparison means.

19. The semi-associative memory of claim 17 further comprising:
masking means for masking selected bits of said key data word group, said masking means controlling said output means to that the data bits corresponding to said masked bits of said key data word group are considered as matched regardless of the contents of said data bits corresponding to said masked bits of said key data word group, thereby allowing the comparison of only the unmasked bits of the key data word with the data word groups to determine the match condition.

20. The semi-associative memory of claim 17 wherein said data word groups comprise digital data words having a predetermined number of bits and said key word group comprises a signal data word having a correspondingly equal number of said bits.

21. The semi-associative memory of claim 17 wherein said memory means comprises a plurality of memory cells arranged in rows and columns with each of said blocks consisting of one row.

22. The semi-associative memory of claim 17, wherein said comparison means comprises:
exclusive NOR means connected between each key data bit and the corresponding data bit of each of said data word groups of said accessed block; and
AND function means, responsive to said exclusive NOR means, for providing a signal to said output means for each data word group indicating whether or not all of said key data bits match the corresponding data bits in said data word group.

23. The semi-associative memory of claim 17, wherein said comparison means for a first key data bit comprises:
a first sense amplifier, said first sense amplifier associated with one of said memory locations in each of said blocks, said first sense amplifier having a data output for providing, upon the access of one of said blocks, a first logic state and a second logic state, depending upon the contents of said associated memory location of said accessed block, and said first sense amplifier having a data complement output providing the logical complement of said data output;
a comparison output means, connected to said data output and to said data complement output, for providing said first logic state to the output means when the contents of a memory location associated with said first sense amplifier matches said first key data bit, and for providing said second logic state to the output means when the contents of said associated memory location does not match said first key data bit.
a first transistor, having a source-to-drain path connected between said data output and said comparison output means, and having its gate coupled to said first key data bit so that when said data output is at said first logic state, said data output is connected to said comparison output means when said first key data bit matches said data output and is disconnected therefrom when said first key data bit does not match said data output, and so that when said data output is at said second logic state, said data output is disconnected from said comparison output means when said first key data bit matches said data output and is connected thereto when said first key data bit does not match said data output; and
a second transistor, having a source-to-drain path connected between said data compement output and said comparison output means, and having its gate coupled to said first key data bit so that when said data output is connected to said comparison output means said data complement output is disconnected from said comparison output means, and so that when said data output is disconnected from said comparison output means, said data complement output means is connected to said comparison output means.

24. The semi-associative memory of claim 23, wherein source-to-drain paths of said first transistor and said second transistor are of the same channel conductivity-type, and wherein the gate of said second transistor is connected to the logical compement of said first key data bit.

25. The semi-associative memory of claim 23, wherein the comparison means for a second key data bit comprises:
a second sense amplifier, said second sense amplifier associated with another of said memory locations, in each of said blocks, in the same data word group as said locations associated with said first sense amplifier, said second sense amplifier having a data output for providing, upon the access of one of said blocks, said first logic state and said second logic state, depending upon the contents of said associated memory location of said accessed block, and said second sense amplifier having a data complement output providing the logical complement of said data output;
a third transistor, having a source-to-drain path connected between said data output of said second sense amplifier and said comparison output means, and having its gate coupled to said second key data bit so that when said data output is at said first logic state, said data output is connected to said comparison output means when said second key data bit matches said data output and is disconnected therefrom when said second key data bit does not match said data output, and so that when said data output is at said second logic state, said data output is disconnected from said comparison output means when said second key data bit matches said data output and is connected thereto when said second key data bit does not match said data output; and
a fourth transistor, having a source-to-drain path connected between said data complement output of said second sense amplifier and said comparison output means, and having its gate coupled to said second key data bit so that when said data output is connected to said comparison output means said data complement output is disconnected from said comparison output means, and so that when said data output is disconnected from said comparison output means, said data complement output means is connected to said comparison output means;
wherein said second logic state is a low impedance condition so that, when either the first key data bit does not match the data output of the first sense amplifier or the second key data bit does not match the data output of the second sense amplifier said comparison output means will provide said second logic state to the output means.

* * * * *